(12) United States Patent
Bol

(10) Patent No.: US 8,420,505 B2
(45) Date of Patent: Apr. 16, 2013

(54) PROCESS FOR MANUFACTURE OF THIN WAFER

(75) Inventor: Igor Bol, Sherman Oaks, CA (US)

(73) Assignee: International Rectifier Corporation, El Segundo, CA (US)

( * ) Notice: Subject to any disclaimer, the term of this patent is extended or adjusted under 35 U.S.C. 154(b) by 929 days.

(21) Appl. No.: 11/691,037

(22) Filed: Mar. 26, 2007

(65) Prior Publication Data

US 2008/0014439 A1    Jan. 17, 2008

Related U.S. Application Data

(60) Provisional application No. 60/785,621, filed on Mar. 25, 2006.

(51) Int. Cl.
*H01L 21/304* (2006.01)

(52) U.S. Cl.
USPC ........... 438/459; 438/692; 438/693; 438/928; 438/977; 257/E21.23; 257/E21.237; 257/E21.599

(58) Field of Classification Search .................. 438/459, 438/692, 693, 928, 977; 257/E21.211, E21.599, 257/E21.23, E21.237; 428/335
See application file for complete search history.

(56) References Cited

U.S. PATENT DOCUMENTS

| | | | | |
|---|---|---|---|---|
| 4,851,366 A * | 7/1989 | Blanchard | ...................... | 438/405 |
| 5,376,561 A * | 12/1994 | Vu et al. | ........................ | 438/118 |
| 5,455,193 A * | 10/1995 | Egloff | ............................ | 438/704 |
| 5,455,202 A * | 10/1995 | Malloy et al. | ................. | 438/118 |
| 5,591,678 A * | 1/1997 | Bendik et al. | ................. | 438/459 |
| 5,618,739 A * | 4/1997 | Takahashi et al. | ............ | 438/158 |
| 6,153,495 A * | 11/2000 | Kub et al. | ...................... | 438/459 |
| 6,287,891 B1 * | 9/2001 | Sayyah | .......................... | 438/106 |
| 6,410,371 B1 * | 6/2002 | Yu et al. | ......................... | 438/151 |
| 6,455,398 B1 * | 9/2002 | Fonstad et al. | ................ | 438/459 |
| 6,526,647 B2 * | 3/2003 | Hatley et al. | .................... | 29/596 |
| 6,556,261 B1 * | 4/2003 | Krusius et al. | .................. | 349/73 |
| 6,562,647 B2 * | 5/2003 | Zandman et al. | ............... | 438/33 |
| 6,677,173 B2 * | 1/2004 | Ota | .................................. | 438/22 |
| 6,869,894 B2 * | 3/2005 | Moore | .......................... | 438/782 |
| 6,878,608 B2 * | 4/2005 | Brofman et al. | .............. | 438/459 |
| 6,919,261 B2 * | 7/2005 | Cunningham | ................ | 438/455 |
| 6,960,490 B2 * | 11/2005 | Cunningham | ................ | 438/107 |
| 7,118,930 B1 * | 10/2006 | Wuu et al. | ........................ | 438/22 |
| 7,122,447 B2 * | 10/2006 | Abe | ................................ | 438/460 |
| 7,358,152 B2 * | 4/2008 | Kub et al. | ....................... | 438/459 |
| 7,462,552 B2 * | 12/2008 | Tong et al. | ...................... | 438/458 |
| 7,501,303 B2 * | 3/2009 | Unlu et al. | ........................ | 438/57 |
| 7,563,629 B2 * | 7/2009 | Lee et al. | .......................... | 438/34 |
| 7,635,639 B2 * | 12/2009 | Val et al. | ........................ | 438/459 |
| 7,772,088 B2 * | 8/2010 | Henley et al. | ................. | 438/458 |
| 2002/0031897 A1 * | 3/2002 | Ueda et al. | ...................... | 438/424 |
| 2005/0255672 A1 * | 11/2005 | Cunningham | ................ | 438/455 |

(Continued)

*Primary Examiner* — Mary Wilczewski
(74) *Attorney, Agent, or Firm* — Farjami & Farjami LLP

(57) ABSTRACT

A process to thin semiconductor wafers to less than 50 microns employs a dissolvable photoresist or polyimide or other glue material to hold a thick carrier plate such as a perforated glass to the top surface of a thick processed wafer and to grind or otherwise remove the bulk of the wafer from its rear surface, leaving only the preprocessed top surface, which may include semiconductor device diffusions and electrodes. A thick metal such as copper or a more brittle copper alloy is then conductively secured to the ground back surface and the glue is dissolved and the carrier plate is removed. The wafer is then cleaned and diced into plural devices such as MOSFETs; integrated circuits and the like.

18 Claims, 3 Drawing Sheets

U.S. PATENT DOCUMENTS

| | | | |
|---|---|---|---|
| 2007/0042606 A1* | 2/2007 | Wang et al. | 438/700 |
| 2007/0093037 A1 | 4/2007 | Zhu et al. | |
| 2008/0014439 A1* | 1/2008 | Bol | 428/337 |
| 2008/0089637 A1* | 4/2008 | Farah | 385/14 |
| 2008/0173960 A1* | 7/2008 | Kotovsky | 257/419 |
| 2010/0035052 A1* | 2/2010 | Farah | 428/336 |

* cited by examiner

US 8,420,505 B2

PROCESS FOR MANUFACTURE OF THIN WAFER

RELATED APPLICATIONS

This application claims the benefit of U.S. Provisional Application No. 60/785,621, filed Mar. 24, 2006, the entire disclosure of which is incorporated by reference herein.

FIELD OF THE INVENTION

This invention relates to semiconductor devices and processes for their manufacture and more specifically relates to a process for manufacture of ultrathin semiconductor wafers and die.

BACKGROUND OF THE INVENTION

Semiconductor die for such applications as low voltage MOSFETs, IGBTs or integrated circuits (ICs) would benefit if formed in an ultrathin wafer, for example a wafer thinner than 50 micrometers and down, for example, to 5 microns. These substrates or die could offer advantages of lower $R_{DSON}$, higher switching speed and improved device ruggedness. High performance microprocessors or ICS would also benefit from improved heat dissipation to the die bottom surface.

However, it is very difficult to thin down the parent wafer for the die to below about 50 micrometers and complete its processing, such as backside metallizing, inspections, probing and assembly. Indeed is currently not even possible to complete and process wafers as thin as 5 to 15 micrometers.

BRIEF SUMMARY OF THE INVENTION

In accordance with the invention, a conventional semiconductor wafer, such as a monocrystalline silicon wafer or other semiconductor material wafer which may have a thickness greater than 300 microns is fully processed except for the backside metal. Thus, the wafer can be formed of a high conductivity bulk volume, which may be 500 microns thick and having a thin, for example, four micron thick epitaxially formed top layer of lower conductivity, which carries the diffusions defining the desired semiconductor die, such as a FET. A temporary glue which can be disabled is then applied to the top processed surface of the thick wafer substrate and permits the gluing of a thick carrier substrate, for example, a thick glass substrate to the top of the wafer. The glue may be a polyimide or photoresist which may be disabled or dissolved by a thermal treatment or by UV radiation or the like.

The backside of the thick semiconductor substrate is then ground or otherwise thinned to a thickness of less than 50 micrometers and even to 5 micrometers if desired with physical strength being provided by the thick carrier substrate. Thereafter, a thick metal substrate is fixed to the ground back surface and the glue is dissolved or otherwise defeated and the carrier substrate is removed. The conductive substrate may be copper or a copper alloy which is sufficiently brittle to be easily cut for die singulation. The metal substrate may have reduced thickness channels to improve back-side cooling.

The wafer is mechanically rugged by virtue of the thick metal contact fixed to the back surface so the final wafer processing steps such as inspection, probing, singulation and die assembly can be conventionally carried out without damage to the wafer.

DETAILED DESCRIPTION OF THE DRAWINGS

Figure 1:
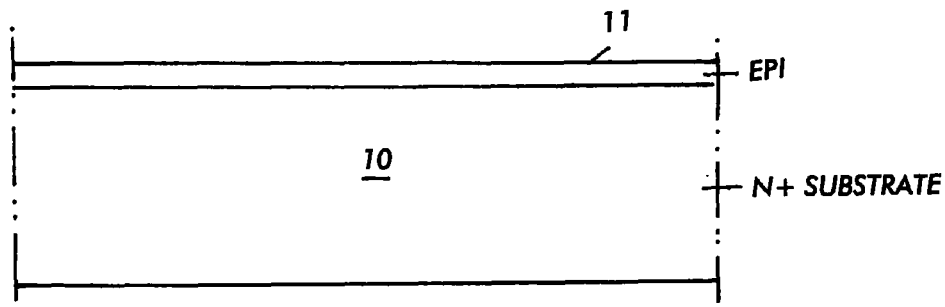
FIG. 1 shows a cross-section of a small portion of a conventionally processed semiconductor wafer except for its back metal.

Referring first to FIG. 1, there is shown a conventionally thick $N^+$ monocrystalline wafer 10 having an epitaxially deposited $N^-$ layer 11 thereon. Substrate 10 will have a thickness greater than about 300 micrometers, and for example, may be 500 micrometers thick, and epitaxial layer 11 may be 2 to 10 micrometers thick, depending on the needs of the devices to be formed. Typically, layer 11 may be about 4 micrometers thick. The wafer is subject to conventional processing to form diffusions in layer 11 and metalization electrodes (not shown) on its surface to form the desired devices. The wafer fabrication process is completed for the wafer of FIG. 1, except for the back metal on the bottom surface of substrate 10.

Figure 2:
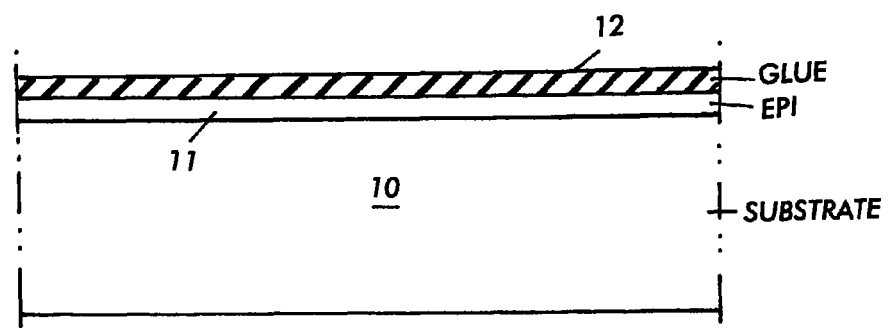
FIG. 2 shows the wafer of FIG. 1 after the coating of the top surface with glue.

The next step in the preferred process is the application of a temporary glue 12 to the top surface of the epi layer 11 as shown in FIG. 2. The glue or adhesive 12 is preferably a polyimide or photoresist, which may be about 5 micrometers thick. The materials may be spin coated on the top surface of epi 11, using a coater track. Any desired adhesive, which can be subsequently controllably released or destroyed can be used.

Figure 3:
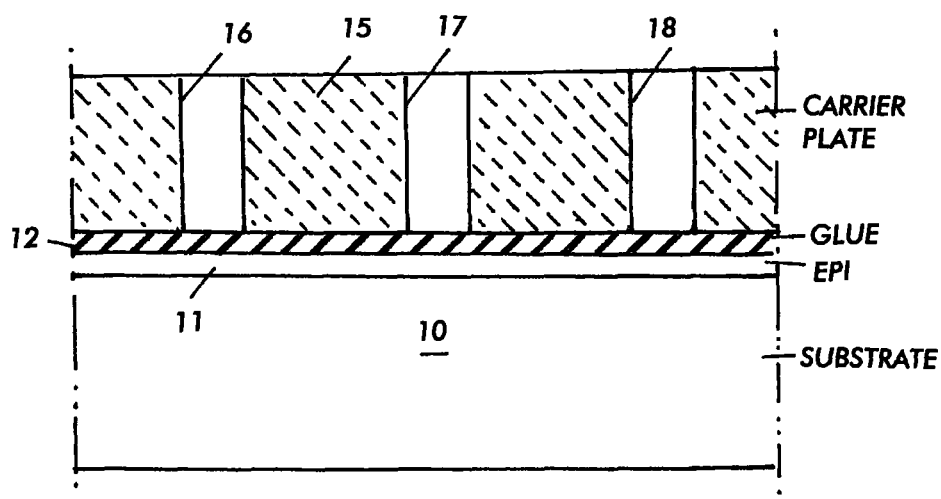
FIG. 3 shows the wafer of FIG. 2 after gluing a carrier plate to the wafer top surface.

As next shown in FIG. 3, a carrier plate 15 is placed atop the glue coating 12, and for a polyimide, the assembly is hot plate baked to adhere the carrier plate 15 to the wafer 10. Carrier plate 15 is preferably glass, and may be perforated with spaced holes 16, 17, 18 of any desired diameter and spacing. These openings will speed up the subsequent release of glue 12 as will be later described.

Figure 4:
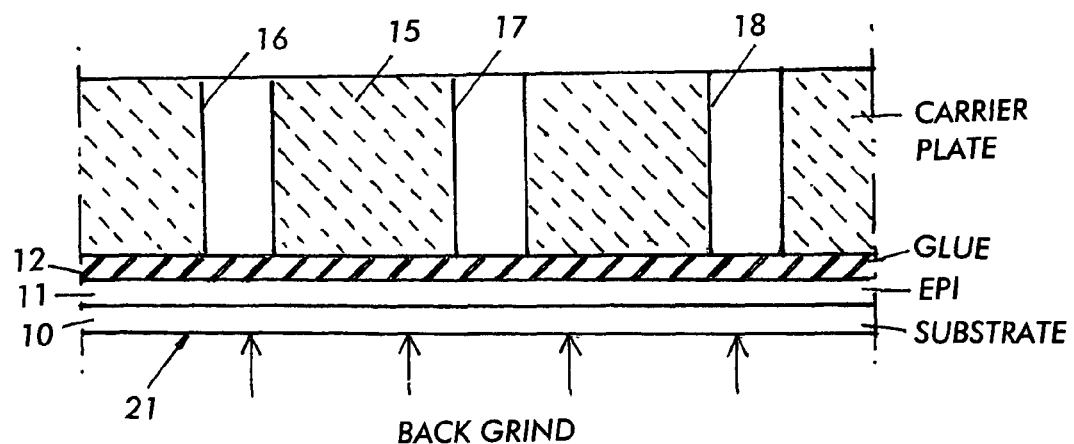
FIG. 4 shows the wafer of FIG. 3 after the thinning of the bulk of the semiconductor wafer from its back surface.

As next shown in FIG. 4, the thickness of substrate 10 is dramatically reduced, as by a conventional back-grind, to less than about 50 micrometers and typically, to only 5 to 10 micrometers. The reinforcing strength of carrier plate 15 permits the back-grind operation without damage to the wafer. This thinning operation will substantially reduce the substrate component of $R_{DSON}$ of a conventional FET and will permit the better transmission of heat from the devices in epi layer 11 to the back of the wafer for improved device cooling.

Figure 5:
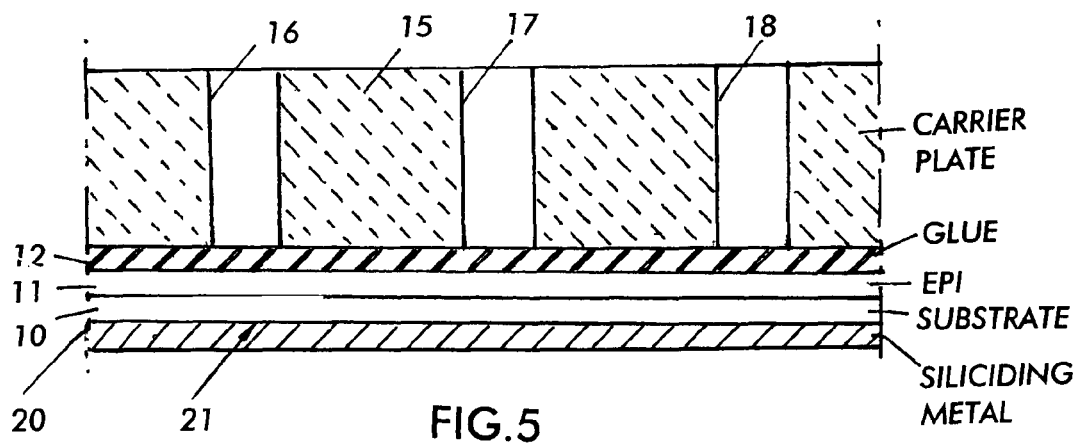
FIG. 5 shows the wafer of FIG. 4 after an optional step of applying a siliciding metal to the reduced thickness back surface of the semiconductor wafer.

Thereafter, and optionally, a thin layer of siliciding metal 20 is formed on the back surface 21 as shown in FIG. 5. The siliciding metal may be Au, Pt or TiP, for example, which are sputtered using a conventional techniques.

Figure 6:
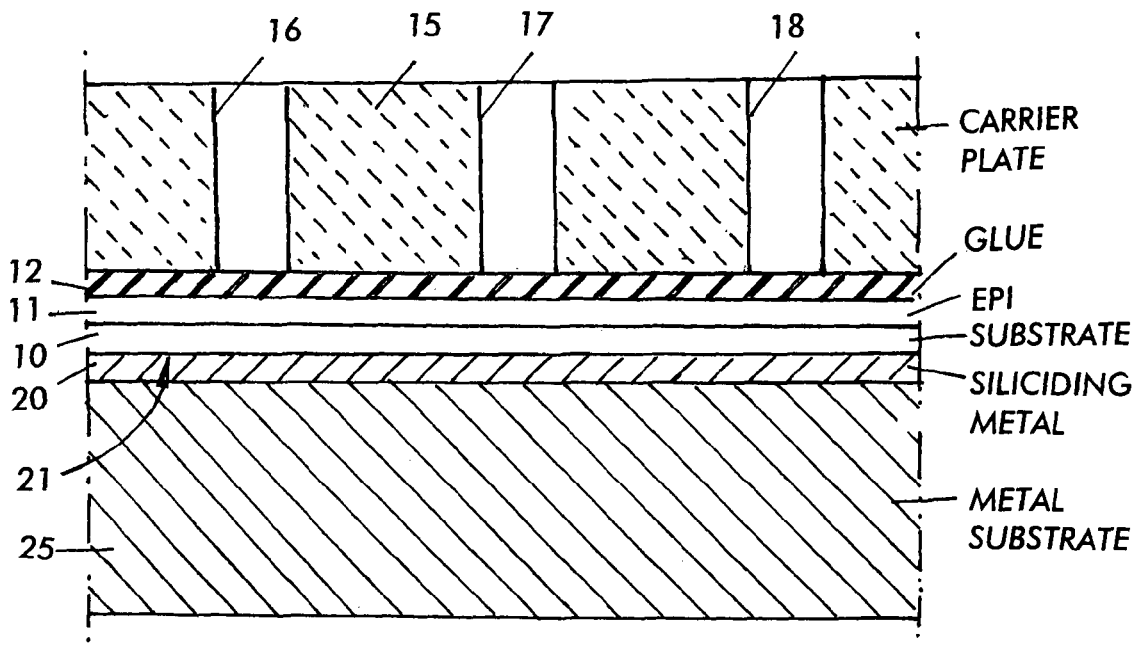
FIG. 6 shows the wafer of FIG. 5 after the attachment of a thick metal substrate to the back surface of the semiconductor wafer.

As next shown in FIG. 6, a conductive substrate 25 is fixed to the siliciding metal 21 or directly to the back surface 20 of substrate 10. By way of example substrate 25 can be fixed to the bottom surface of metal 21 by a conductive epoxy and baked at relatively low temperature of about 120° C. until the epoxy is cured sufficiently to hold substrate 25 to silicide 21 but not yet fully cured. However, a higher temperature that would cause glue 12 to release cannot be used. Substrate 25 may be copper or a brittle copper alloy which can be sawn without clogging the saw blade and may have a thickness (non-critical) of about 500 micrometers.

Figure 7:
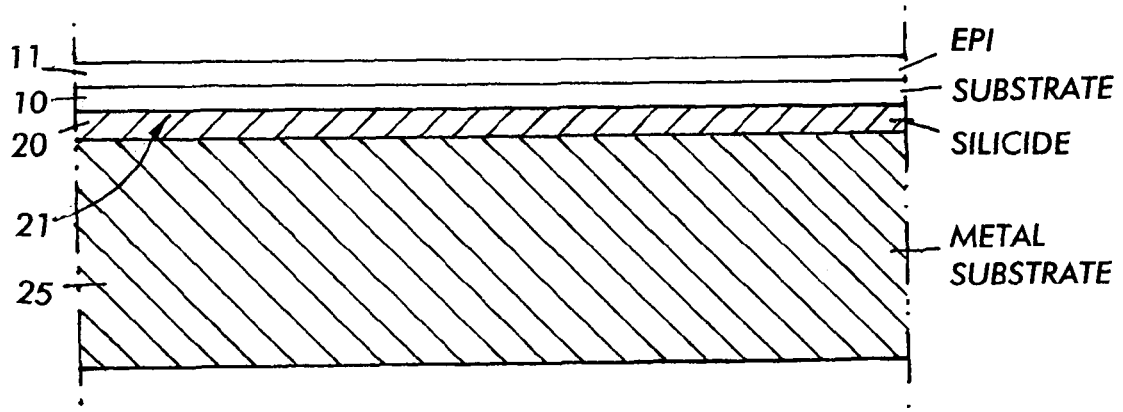
FIG. 7 shows the wafer of FIG. 6 after the destruction of the glue layer and the removal of the carrier plate from the wafer top surface.

Thereafter, and as shown in FIG. 7, the carrier plate 15 is removed by deactivating the glue 12 in FIG. 6. By way of example, the polyamide glue may be dissolved or the photoresist can be exposed through the glass plate 15 to destructive treatment, such as heating or radiation. The carrier substrate or plate 15 is then removed.

The epoxy holding the metal substrate 25 to silicide metal 21 is then fully cured as at 350° C.

Note that the back side of metal substrate 25 may be made as thick as desired and may be grooved in a cross-hatch pattern or the like to increase heat dissipation from the metal substrate 25.

The wafer of FIG. 7 may now be probed and diced, and the finished die can be mounted or packaged for use.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for producing a semiconductor wafer of thickness less than about 50 micrometers, comprising:
    processing a top surface of a thick semiconductor wafer to form desired diffusions and metallizations in and on said top surface;
    gluing a carrier plate to said top surface with a temporary glue, wherein said carrier plate contains spaced perforations therethrough;
    thinning the bulk of said semiconductor wafer from its rear surface to a thickness less than 50 micrometers after said gluing;
    attaching a reinforcing substrate comprising only metallic materials to said rear surface, said reinforcing substrate configured to mechanically reinforce said semiconductor wafer during a final wafer processing; and
    thereafter disabling said temporary glue and removing said carrier plate.

2. The process of claim 1, which further includes the step of singulating semiconductor die from said semiconductor wafer.

3. The process of claim 1, wherein said semiconductor wafer has an initial thickness greater than about 300 micrometers.

4. The process of claim 3, wherein an epitaxially formed junction-receiving layer of thickness less than about 5 micrometers is formed atop said top surface;
    said diffusions being formed in said epitaxially formed junction-receiving layer.

5. The process of claim 4, wherein the bulk of said semiconductor wafer is an $N^+$ or $P^-$ monocrystalline silicon.

6. The process of claim 1, wherein an epitaxially formed junction-receiving layer of thickness less than about 5 micrometers is formed atop said top surface;
    said diffusions being formed in said epitaxially formed junction-receiving layer.

7. The process of claim 6, wherein the bulk of said semiconductor wafer is an $N^+$ or $P^-$ monocrystalline silicon.

8. The process of claim 6, wherein said semiconductor wafer is thinned to less than about 10 micrometers.

9. The process of claim 8, which further includes the step of singulating semiconductor dies from said semiconductor wafer.

10. The process of claim 1, wherein said temporary glue is one of a photoresist or polyimide.

11. The process of claim 5, wherein said temporary glue is one of a photoresist or polyimide.

12. The process of claim 1, wherein said carrier plate is glass.

13. The process of claim 1, wherein said semiconductor wafer is thinned by grinding back said rear surface.

14. The process of claim 1, wherein said reinforcing substrate is copper or a copper alloy.

15. The process of claim 1, wherein said reinforcing substrate has a thickness greater than about 300 micrometers.

16. The process of claim 15, wherein said reinforcing substrate is copper or a copper alloy.

17. The process of claim 16, which further includes the step of singulating semiconductor dies from said semiconductor wafer.

18. The process of claim 17, wherein said semiconductor wafer is thinned to less than about 10 micrometers.

* * * * *